US006285256B1

(12) United States Patent
Wong

(10) Patent No.: US 6,285,256 B1
(45) Date of Patent: Sep. 4, 2001

(54) LOW-POWER CMOS VOLTAGE FOLLOWER USING DUAL DIFFERENTIAL AMPLIFIERS DRIVING HIGH-CURRENT CONSTANT-VOLTAGE PUSH-PULL OUTPUT BUFFER

(75) Inventor: Anthony Yap Wong, Cupertino, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 0 days.

(21) Appl. No.: 09/553,502

(22) Filed: Apr. 20, 2000

(51) Int. Cl.[7] .............................. H03F 3/45; H03F 3/26
(52) U.S. Cl. ............................................ 330/255; 330/265
(58) Field of Search ..................................... 330/253, 255, 330/261, 264, 265

(56) References Cited

U.S. PATENT DOCUMENTS

| | | | |
|---|---|---|---|
| 4,264,873 | 4/1981 | Kominani ............................... | 330/257 |
| 4,335,355 | 6/1982 | Haque .................................... | 330/253 |
| 4,446,383 | 5/1984 | Concannon et al. .................. | 307/297 |
| 5,235,520 | 8/1993 | Yokouchi .............................. | 364/480 |
| 5,465,073 | 11/1995 | Satoh .................................... | 330/258 |
| 5,532,579 | 7/1996 | Park ...................................... | 323/314 |
| 5,606,281 * | 2/1997 | Gloaguen .......................... | 330/255 X |
| 5,644,258 | 7/1997 | Wu ....................................... | 327/110 |
| 5,670,910 | 9/1997 | Kato ..................................... | 330/253 |
| 5,847,606 | 12/1998 | Shacter ................................. | 330/253 |
| 5,886,578 | 3/1999 | Miyashita et al. .................... | 330/253 |
| 5,933,051 | 8/1999 | Tsuchida et al. ..................... | 327/543 |
| 6,066,985 * | 5/2000 | Xu ........................................ | 330/253 |

* cited by examiner

Primary Examiner—Steven J. Mottola
(74) Attorney, Agent, or Firm—Stuart T. Auvinen

(57) ABSTRACT

An amplifier designed from CMOS transistors provides a high current output, despite having a unity-gain configuration. A push-pull output stage drives the output using a p-channel pull-up transistor and an n-channel pull-down transistor. The pull-down transistor's gate is driven by an output from an inverting differential amplifier, that has one differential transistor gate driven by an input voltage and the other driven by the output voltage. A second differential amplifier is configured as a non-inverting differential amplifier, with one differential transistor gate driven by the input voltage and the other driven by the output voltage. The second differential amplifier drives an n-channel gate of an inverting stage, and the output of the inverting stage drives the p-channel pull-up transistor's gate. When the input voltage is above the output voltage, the inverting differential amplifier drives a lower voltage to the gate of the pull-down transistor, reducing sink current, while the inverting stage drives a lower voltage to the gate of the pull-up transistor, increasing source current. Both the pull-up and pull-down transistors work together to raise the output voltage.

18 Claims, 4 Drawing Sheets

LOW-POWER CMOS VOLTAGE FOLLOWER USING DUAL DIFFERENTIAL AMPLIFIERS DRIVING HIGH-CURRENT CONSTANT-VOLTAGE PUSH-PULL OUTPUT BUFFER

FIELD OF THE INVENTION

This invention relates to complementary metal-oxide-semiconductor (CMOS) amplifiers, and more particularly to unity-gain low-power push-pull amplifiers.

BACKGROUND OF THE INVENTION

Analog amplifiers such as operational amplifiers (op amps) have been widely produced using a variety of technologies, such as Bipolar semiconductors. More recently, complementary metal-oxide-semiconductor (CMOS) technology has been employed for such analog amplifiers. See for example U.S. Pat. No. 5,670,910 by Kato, and assigned to NEC Corp. Sometimes such analog amplifiers are integrated onto the same silicon substrate as digital sub-systems, in a mixed-signal integrated circuit (IC).

FIG. 1 is a high-level diagram of an amplifier connected in a unity-gain configuration. Amplifier 10 has differential inputs + and −, known as non-inverting and inverting inputs. The difference in the voltages of signals applied to the + and − inputs is amplified and output from amplifier 10 as signal Vo. Amplifier 10 is known as a differential amplifier, since the difference in input voltages is amplified, rather than the absolute voltage on any one input.

Input voltage Vin is applied to the non-inverting + input of amplifier 10. Both input voltage Vin and output voltage Vo are referenced to a ground, normally 0 volts. The output voltage Vo is fed back to the inverting − input of amplifier 10. Since amplifier 10 amplifies any difference in voltage between its two inputs, amplifier 10 is in a stable steady-state condition when the two input have the same voltage. Amplifier 10 adjusts output voltage Vo until it matches the input voltage Vin. When Vo is lower than Vin, amplifier 10 sees a positive voltage difference on its inputs and drives the output voltage Vo higher until Vo reaches Vin. When Vo is above Vin, amplifier 10 sees a negative voltage difference on its inputs and drives the output voltage Vo lower until Vo reaches Vin.

Since the feedback to amplifier 10 acts to drive its output Vo to the same voltage as its input Vin, the voltage amplification or gain in steady state is one. The feedback connection of amplifier 10 is known as a unity-gain configuration. Note that the current delivered by amplifier 10 may increase if Vin increases to reduce output sink current; thus a large current gain can still be provided by the unity-gain amplifier. Such a unity-gain amplifier is sometimes known as a voltage-follower circuit. Such unity-gain amplifiers are often used as a buffer to increase drive capacity.

FIG. 2 is a circuit for a CMOS analog amplifier that implements the unity-gain amplifier of FIG. 1. The drain of p-channel transistor 26 supplied current to resistor 28, forming a voltage-reference generator. The IR drop through resistor 28 determines the bias voltage that is applied to the gates of p-channel transistors 26, 22, 20, so that p-channel transistors 22, 20 act as current sources with currents referenced to the current through p-channel transistor 26.

P-channel transistors 12, 14 form a differential pair that switch current from p-channel transistor 22 to either n-channel transistor 16 or 18. A current mirror is set up by n-channel transistor 16, 18, since their gates are connected together, providing the same gate-to-source voltage Vgs. Together, p-channel transistors 22, 12, 14 and n-channel transistors 16, 18 form a CMOS differential amplifier.

The drain of transistor 12 is connected to the gate of n-channel output transistor 24. An output stage is composed of p-channel transistor 20 and n-channel transistor 24. However, since p-channel transistor 20 has its gate driven by the bias voltage from resistor 28, p-channel transistor 20 acts as a current source, outputting a constant current. Only the sink current through n-channel output transistor 24 varies.

The output voltage Vo is taken from the drains of transistors 20, 24, and fed back to the gate of p-channel transistor 14. Thus one of the differential pair of transistors 12, 14 is driven by Vin while the other is driven by Vo. This provides the unity-gain configuration with feedback of Vo.

When Vin rises above Vo, p-channel transistor 12 turns off more than transistor 14, so more current passes through transistors 14, 18. The gate-to-source voltage of transistor 18 must rise to accommodate the higher current flow. This higher gate voltage is mirrored to n-channel transistor 16, resulting in more current through n-channel transistor 16. Since more current is passing through n-channel transistor 16, but less current through p-channel transistor 12, the drains of transistors 12, 16 fall in voltage. This voltage drop is applied to the gate of output transistor 24, reducing the current sink through transistor 24. The reduced current sink, together with a constant current source from p-channel transistor 20, raises the output voltage Vo until Vo matches the rise in Vin.

While such an analog amplifier is useful, the amount of current from the output stage is limited. The output current is equal to the current sourced from p-channel transistor 20, minus the current sinked through n-channel output transistor 24. Since p-channel transistor 20 has a fixed gate voltage, the source current is constant. Only the sink current changes as the gate of n-channel output transistor 24 is varied. In practical cases, the maximum source current to the output is about half of the constant current which p-channel transistor 20 can supply. The gate voltages of transistor 24 must stay within a limited range for the circuit to operate properly. This limits the variation of sink current that can occur.

Much of the current through output transistors 20, 24 is wasted, being sent from power to ground, with a limited amount of current being sourced to the output. A large output current is often required by loading of the output, forcing high currents through transistors 20, 24. This high current is undesirable from a power-budget view, since the chip's power-supply current specification must increase to supply the current to p-channel transistor 24. Heat dissipation can also be a concern, and large transistor sizes may be needed that require more die area, increasing cost.

What is desired is a unity-gain amplifier constructed from CMOS transistors. A lower-power amplifier output stage is desired that can still source and sink a large current from the output. Reduced power-to-ground current in the output stage is desired. An active push-pull output stage for a unity-gain amplifier is desired. Reduced waste current in a high-current-drive amplifier is desired.

SUMMARY OF THE INVENTION

A unity-gain amplifier has an input for receiving an input voltage and an output having an output voltage. A first differential amplifier receives the input voltage and the output voltage. It generates a first voltage on a first node. The first voltage rises when the input voltage rises above the output voltage.

An inverting stage is coupled to the first node. It receives the first voltage and generates a second voltage on a second node. The second voltage falls when the first voltage rises.

A pull-up transistor has a gate coupled to the second node. It drives a source current to the output. The pull-up transistor drives a larger source current when the second voltage is falling.

A second differential amplifier receives the input voltage and the output voltage. It generates a third voltage on a third node. The third voltage falls when the input voltage rises above the output voltage.

A pull-down transistor has a gate coupled to the third node. It drives a sink current from the output. The pull-down transistor drives a smaller source current when the second voltage is falling. The pull-up transistor drives a larger current but the pull-down transistor drives a smaller current when the input voltage rises above the output voltage. Thus the unity-gain amplifier is a push-pull differential amplifier.

In further aspects a bias-voltage generator is coupled to the first differential amplifier and the second differential amplifier. It generates a bias voltage that is independent of the input voltage and the output voltage. The bias voltage is applied to the first and second differential amplifiers.

In still further aspects the pull-up transistor is a p-channel transistor having a source connected to a power supply and a drain connected to the output and a gate connected to the second node. The pull-down transistor is an n-channel transistor having a source connected to a ground and a drain connected to the output and a gate connected to the third node. Thus an output stage uses p-channel and n-channel transistors.

In still further aspects the first differential amplifier is a differential amplifier having the input coupled to a non-inverting differential gate and the output connected to an inverting differential gate. The second differential amplifier is a differential amplifier having the output coupled to a non-inverting differential gate and the input connected to an inverting differential gate. The first differential amplifier is a non-inverting amplifier but the second differential amplifier is an inverting amplifier.

In still further aspects the first and second differential amplifiers each have a current-source transistor with a gate that receives the bias voltage and a drain coupled to a split node. An inverting differential transistor is controlled by the inverting differential gate. It conducts current from the split node to an output node. The output node is the first node for the first differential amplifier but the third node for the second differential amplifier.

An inverting-leg current-mirror transistor has a gate connected to a current-mirror node. It conducts a mirrored current from the output node. A non-inverting differential transistor is controlled by the non-inverting differential gate. It conducts current from the split node to the current-mirror node. A non-inverting-leg current-mirror transistor has a gate and a drain connected to the current-mirror node. It conducts a mirrored current from the current-mirror node. Thus dual-leg differential amplifiers are used.

In other aspects the current-source transistor is a p-channel transistor with a source connected to the power supply while the differential transistors are p-channel transistors. The current-mirror transistors are n-channel transistors with sources connected to the ground.

In further aspects of the invention the inverting stage has an n-channel inverting transistor with a gate connected to the first node, a source connected to the ground, and a drain connected to the second node. A p-channel inverting transistor has a source connected to the power supply, and a gate and a drain together connected to the second node. Thus the inverting stage has an active pull-down but a passive pull-up.

DETAILED DESCRIPTION

The present invention relates to an improvement in CMOS unity-gain amplifiers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that removing the current source from the output stage can significantly reduce wasted current. The current source can be replaced with an active driver. Both the pull-up and pull-down output transistors can be actively driven by differential amplifiers.

The inventor has realized that a push-pull output stage can be used with a unity-gain amplifier. A pair of CMOS differential amplifiers can be used, one driving each of the output transistors. An intermediate inverting stage can be used to drive the pull-up transistor from one of the differential amplifiers. Current sources are only required for the tail transistors in the internal differential amplifier stages. Since these internal stages do not directly drive the output, the amount of current needed is relatively low. A lower-power unity-gain amplifier is thus realized.

Figure 1:
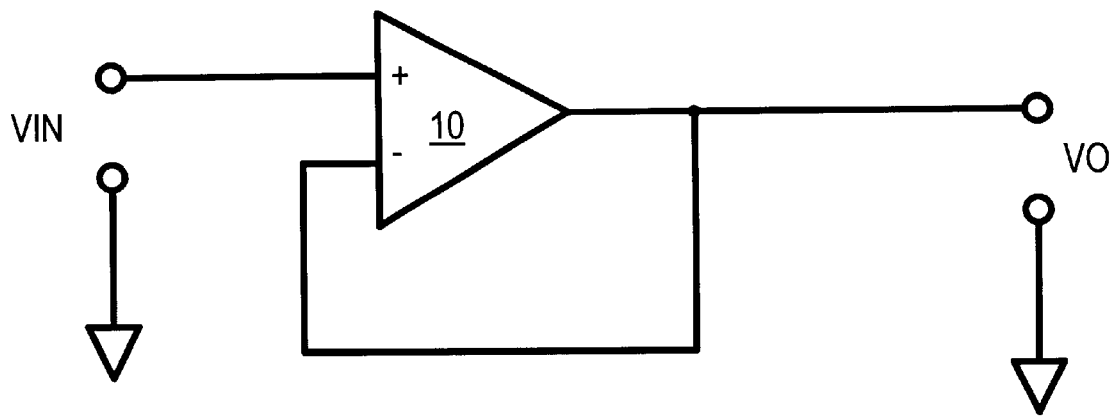
FIG. 1 is a high-level diagram of an amplifier connected in a unity-gain configuration.
Figure 2:
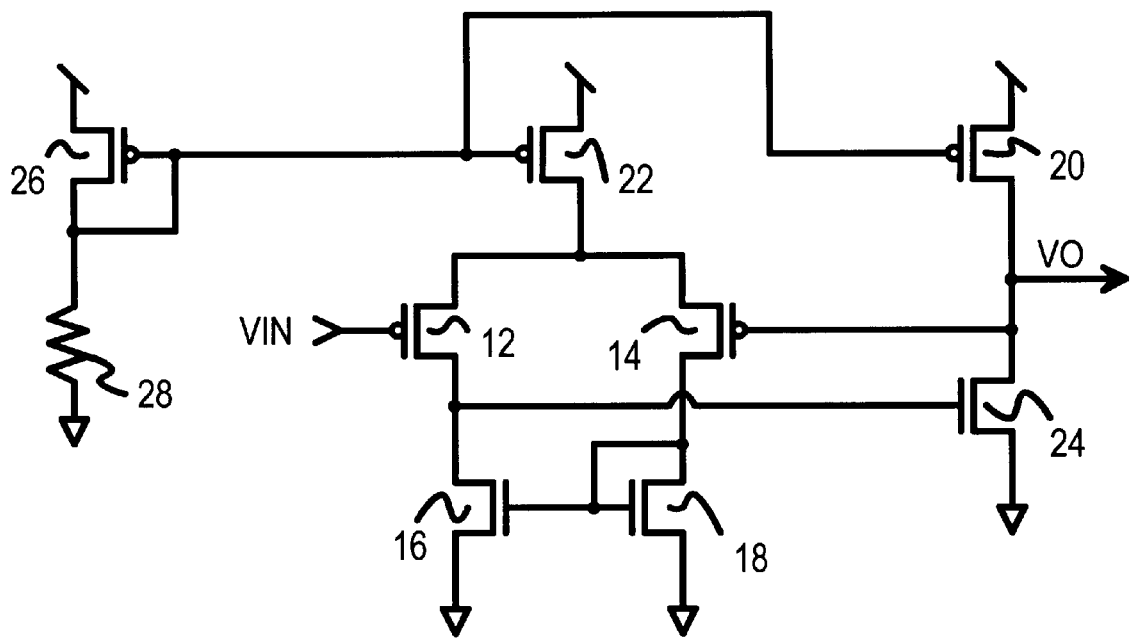
FIG. 2 is a circuit for a CMOS analog amplifier that implements the unity-gain amplifier of FIG. 1.
Figure 3:
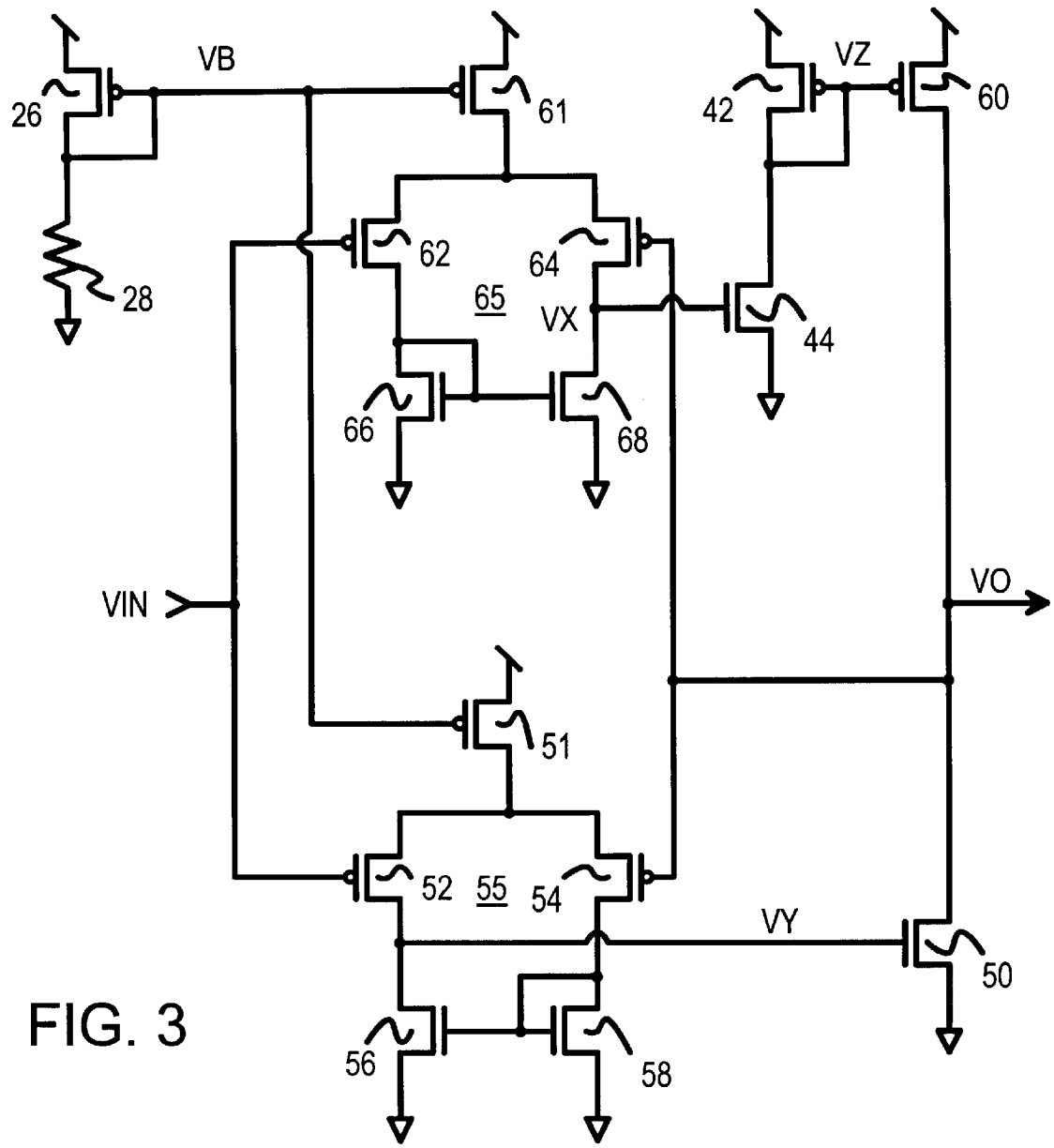
FIG. 3 is a schematic of a CMOS push-pull unity-gain amplifier.

Push-Pull Unity-Gain Amplifier—FIG. 3

FIG. 3 is a schematic of a CMOS push-pull unity-gain amplifier. P-channel bias transistor 26 has its gate connected to its drain, and acts as a current source. The current sourced by bias transistor 26 is sent to ground through resistor 28. The I-R drop through resistor 28 produces a bias voltage VB. This bias voltage VB is applied to the gates of p-channel source transistors 61, 51, causing these to act as current sources for amplifiers 65, 55.

Two differential amplifiers are used. Non-inverting differential amplifier 65 is formed by p-channel source transistor 61, p-channel differential transistors 62, 64, and n-channel current-mirror transistors 66, 68. Likewise, inverting differential amplifier 55 is formed by p-channel source transistor 51, p-channel differential transistors 52, 54, and n-channel current-mirror transistors 56, 58.

The input voltage, Vin, is applied to the gates of p-channel differential transistors 52, 62, while the output voltage Vo is applied to the gates of the other p-channel differential transistor 54, 64 in each differential amplifier 55, 65. Thus each differential pair of transistors has one input driven by Vin, and the other input driven by Vo.

The output and gate-drain connections in differential amplifiers 55, 65 differ. For inverting differential amplifier 55, the gates of n-channel current-mirror transistors 56, 58 are connected together and to the drain of transistors 54, 58, the Vo leg of the differential amplifier. The output of inverting differential amplifier 55, voltage VY, is connected to the drain of transistors 52, 56, which is the Vin leg of the differential amplifier. These internal connections cause differential transistor 52 receiving Vin to act as the inverting (−) input while differential transistor 54 receiving Vo acts as the non-inverting (+) input for inverting differential amplifier 55.

For non-inverting differential amplifier 65, the gates of n-channel current-mirror transistors 66, 68 are connected together and to the drain of transistors 62, 66, the Vin leg of the differential amplifier. The output of non-inverting differential amplifier 65, voltage VX, is connected to the drain of transistors 64, 68, which is the Vo leg of the differential amplifier. These internal connections cause differential transistor 62 receiving Vin to act as the non-inverting (+) input while differential transistor 64 receiving Vo acts as the inverting (−) input for non-inverting differential amplifier 65.

The output VY of inverting differential amplifier 55 drives the gate of n-channel output transistor 50, which sinks current from output Vo to ground. The output VX of non-inverting differential amplifier 65 is first inverted by an inverting stage of transistors 42, 44. Output voltage VX drives the gate of n-channel inverting transistor 44, which has its source connected to ground and its drain connected to the drain of p-channel inverting transistor 42. The gate and drain of p-channel inverting transistor 42 are connected together so that p-channel inverting transistor 42 acts to source current to n-channel inverting transistor 44.

The gate and drain of p-channel inverting transistor 42 is node voltage VZ, which drives the gate of p-channel output transistor 60. P-channel output transistor 60 has its drain connected to output Vo and its source connected to the power supply, and it acts to source current to the output to modulate output voltage Vo.

Operation

The unity-gain amplifier of FIG. 3 operates to match output voltage Vo to input voltage Vin, while sinking or souring a large output current. At steady-state, Vo matches Vin, so that the same amount of current passes through each leg of non-inverting differential amplifier 65, since the same gate voltages (Vin, Vo) are applied to the differential transistors 62, 64. Likewise, current from source transistor 51 is evenly split between each leg since differential transistors 52, 54 are biased with the same gate voltages in inverting differential amplifier 55.

When the input voltage Vin is raised slightly, a reduced gate-to-source voltage occurs on p-channel differential transistors 52, 62, since the sources of transistors 52, 62 is biased to about 2 to 2.5 volts for a 3.3-volt power supply. This reduced gate-to-source voltage reduces the current drive through differential transistors 52, 62, steering the constant current provided by source transistors 51, 61 through the other legs with differential transistors 54, 64.

The drain voltages of each leg were originally equal, but now diverge with the current shift. For inverting differential amplifier 55, the increased current through differential transistor 54 and n-channel current-mirror transistor 58 causes the gate and drain voltages of current-mirror transistor 58 to rise to allow the larger current flow. The higher gate voltage is also applied to current mirror transistor 56, which lowers its drain voltage, which is the voltage VY. The lower voltage VY causes n-channel output transistor 50 to have a lower gate-to-source voltage and thus sink less current. The lower current through output transistor 50 causes the output voltage Vo to rise.

For non-inverting differential amplifier 65, the reduced current through differential transistor 62 and n-channel current-mirror transistor 66 causes the gate and drain voltages of current-mirror transistor 66 to fall to match the smaller current flow. The lower gate voltage is also coupled to current mirror transistor 68, producing a higher resistance through current mirror transistor 68, raising the output voltage VX. The higher voltage VX is applied to the gate of n-channel inverting transistor 44, resulting in increased current through the inverting stage. The drain voltage VZ is pulled lower by the increased current through n-channel inverting transistor 44.

The lower voltage VZ is applied to the gate of p-channel output transistor 60, resulting in a larger gate-to-source voltage drive on p-channel output transistor 60. A higher current is sourced through transistor 60. This higher source current acts to raise the output voltage Vo. Along with the lower sink current through n-channel output transistor 50, the output voltage Vo is pulled and pushed higher in voltage. Both output transistors 50, 60 operate together to move the output voltage in the same direction: p-channel output transistor 60 increases current, while n-channel output transistor 50 decreases current.

When Vin falls, the opposite behavior occurs. More current is steered through differential transistors 52, 62, causing higher voltage drops through their current-mirror transistors 56, 66, and their drains to rise in voltage. The higher VY increases pull-down current through n-channel output transistor 50, while the lower VX reduces current through n-channel inverting transistor 44, raising VZ, and reducing pull-up current through p-channel output transistor 60. The reduced pull-up current and increased pull-down current drives Vo lower until it matches Vin.

Changes in the output voltage Vo can occur due to external factors such as changing loading conditions. Since the output voltage Vo is fed back to differential transistors 54, 64, differential amplifiers 55, 65 can adjust the output current to re-adjust Vo back to match Vin. For example, when Vo is pulled above Vin, current decreases through differential transistors 54, 64. Their drains fall in voltage. VX falls, VY and VZ increase, so that pull-down current increases but pull-up current decreases, reducing Vo until it matches Vin.

Figure 4A:
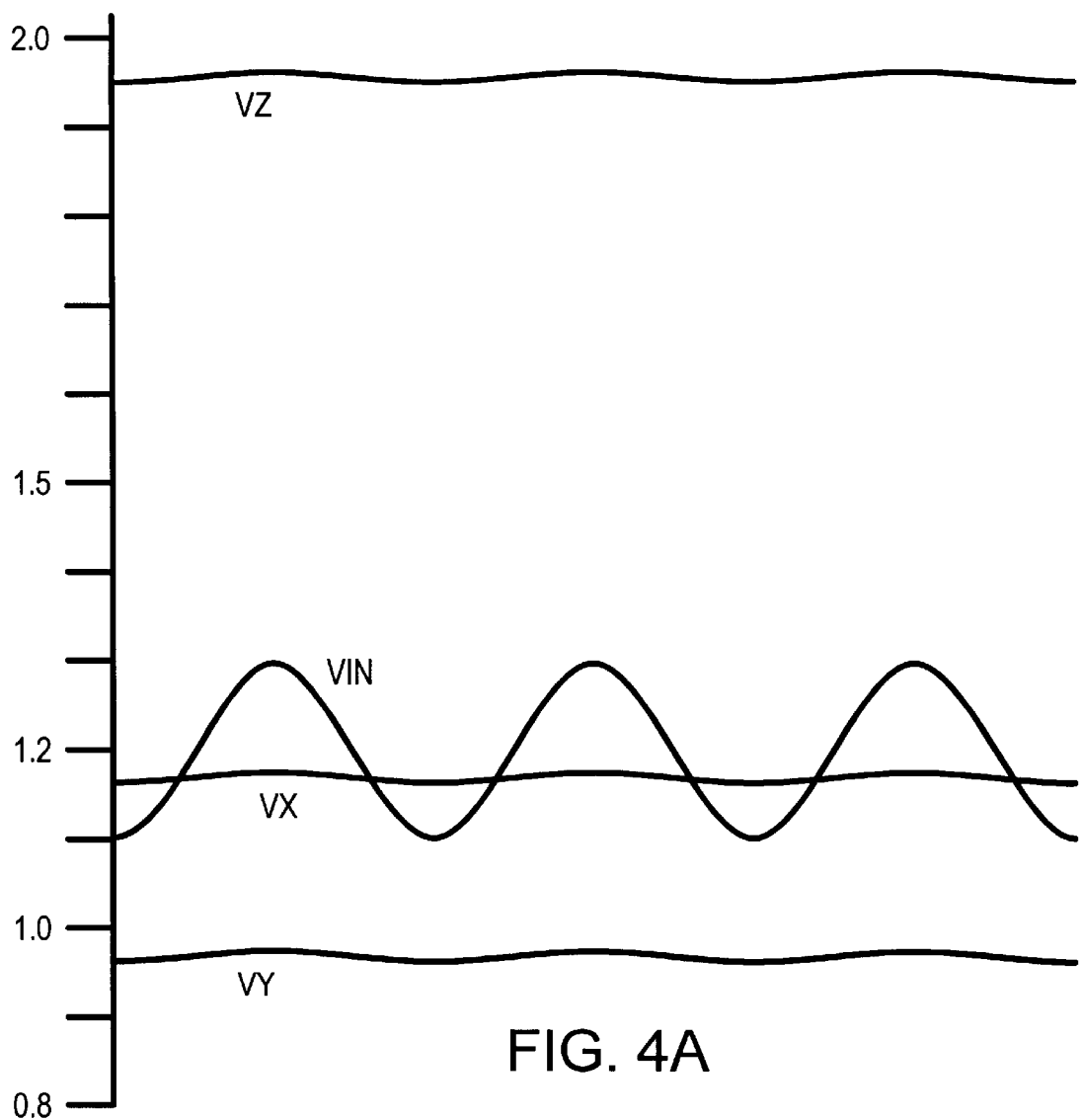
FIGS. 4A, B shown waveforms of input, output, and internal voltages for the unity-gain amplifier of FIG. 3.

Waveforms—FIGS. 4A, B

FIGS. 4A, B shown waveforms of input, output, and internal voltages for the unity-gain amplifier of FIG. 3. A power-supply voltage of 3.3 volts is applied. Input voltage Vin is varied between 1.1 to 1.3 volts as a sine wave in this example. In actual circuits, the input voltage Vin can vary in a non-regular manner within a wider range.

The inverting differential amplifier produces VY, which varies slightly from about 961.4 to 961.8 milliVolts (mV), in approximately a sine wave. This is a range of about 0.4 millivolts. The non-inverting differential amplifier generates VX, which varies from 1.163 to 1.168 volts, a range of about 5 millivolts. The inverted signal applied to the p-channel output transistor gate, VZ, varies from 1.950 to 1.955 volts, a range of 5 mV.

Figure 4B:
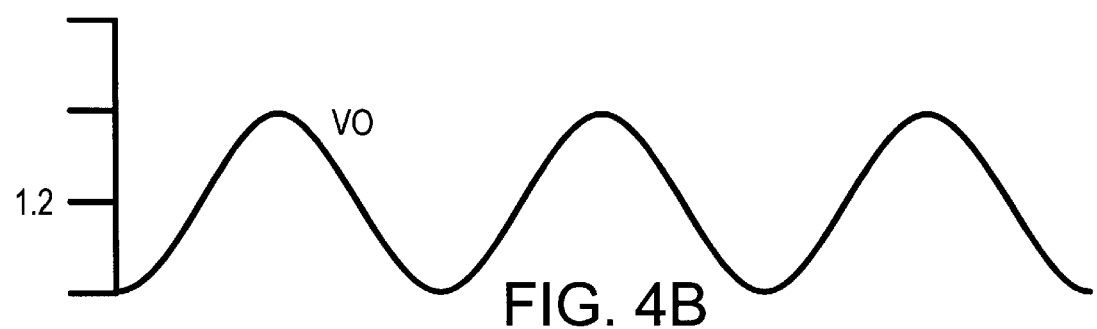

The output voltage, Vo, varies as shown in FIG. 4B. The output varies in the same sine-wave pattern applied to the input Vin in this simulation. The output ranges from 1.1 to 1.3 volts, the same range as the input.

Of course, different voltage ranges and internal bias voltages can be achieved by varying the transistor sizes and process technology. These waveforms are merely shown as an example, and the circuit can operate with many other input test patterns and real-application signals that do not follow a simple repeating pattern.

ADVANTAGES OF THE INVENTION

A unity-gain amplifier is constructed from CMOS transistors. A lower-power amplifier is described that can still source and sink a large current from the output. Reduced power-to-ground current in the output stage is featured. An active push-pull output stage drives the output of the unity-gain amplifier. Reduced waste current in achieved in a high-current-drive amplifier.

The input transistor pair in a differential amplifier can create an input offset voltage due to process variations, transistor geometry mismatch, or transistor type. The mismatched input offset voltage between the two differential amplifiers can cause different voltage gain which reduces the push-pull effect and increases waste current in the output stage. The worst situation is when a p-channel transistor pair is used in one differential amplifier while an n-channel pair is used in the other differential amplifier.

In the invention, mismatch input offset voltage between the two differential amplifiers is very small, since both differential amplifiers use the same type of transistor for the differential pair. The transistor geometry also is well matched.

ALTERNATE EMBODIMENTS

Several other embodiments are contemplated by the inventor. For example other circuit components can be added, and parasitic devices are usually present. Different process technologies can be substituted, and more advanced transistors can be used. Many combinations of device sizes can be used. Various supply voltages can be substituted. Voltages can match by being equal, or substantially equal, or by having an offset such as could occur if device sizes are ratioed rather than being exactly the same.

Figure 5:
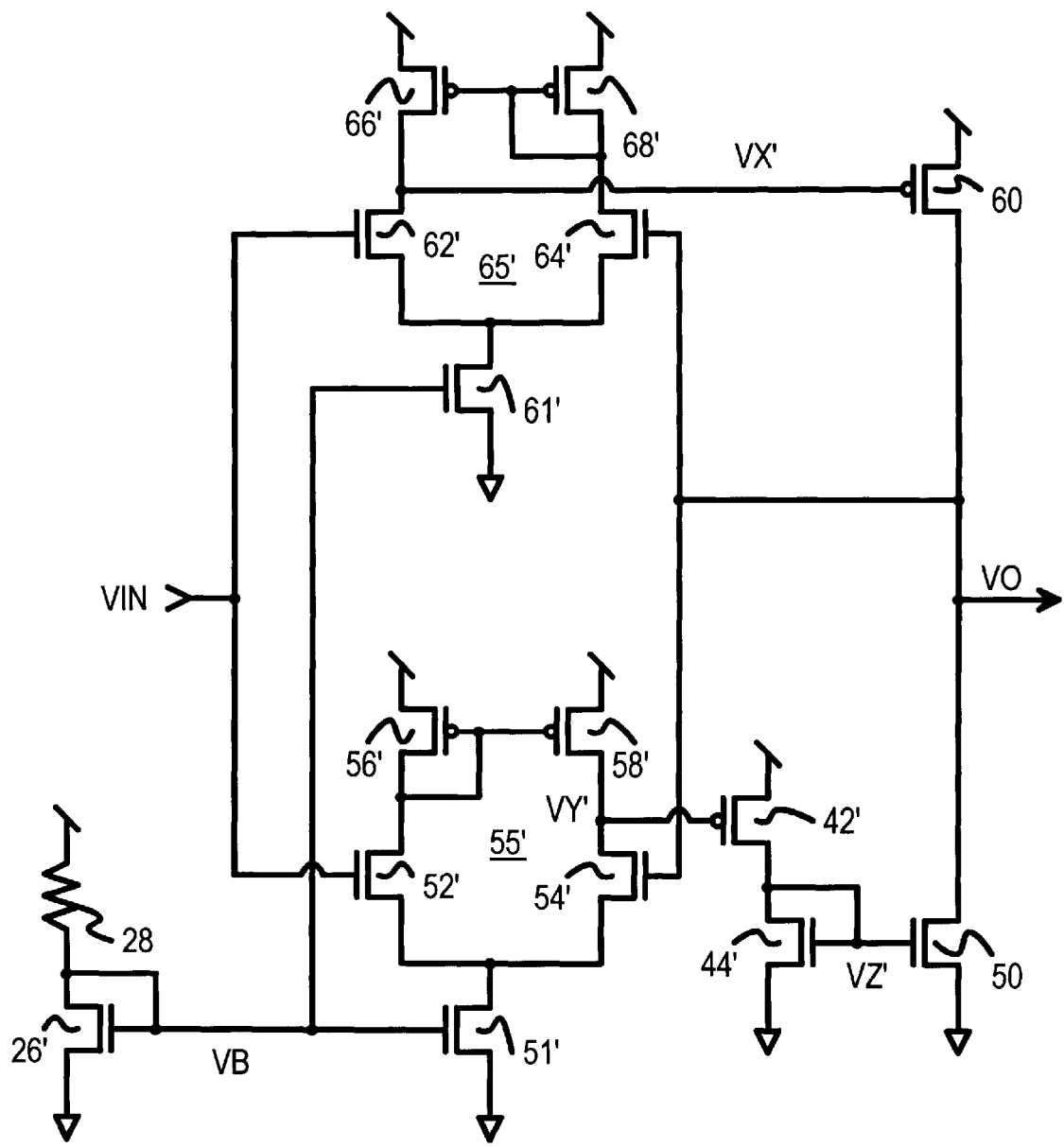
FIG. 5 shows an alternate embodiment that reverses p-channel and n-channel transistors for the amplifiers and the inverting stage and voltage divider.

FIG. 5 shows an alternate embodiment that reverses p-channel and n-channel transistors for amplifiers 55',65' and the inverting stage and voltage divider. The circuit operates in a similar manner to that of FIG. 3. N-channel bias transistor 26' and resistor 28 act as a voltage divider to produce bias voltage VB applied to the gates of n-channel source transistors 61', 51'.

Inverting differential amplifier 65' is formed by n-channel source transistor 61', n-channel differential transistors 62', 64', and p-channel current-mirror transistors 66', 68'. Likewise, non-inverting differential amplifier 55' is formed by n-channel source transistor 51', n-channel differential transistors 52', 54', and p-channel current-mirror transistors 56', 58'.

The input voltage Vin is applied to the gates of n-channel differential transistors 52', 62', while the output voltage Vo is applied to the gates of the other n-channel differential transistor 54', 64'.

For non-inverting differential amplifier 55', the gates of p-channel current-mirror transistors 56', 58' are connected together and to the drain of transistors 52', 56', the Vin leg of the differential amplifier. The output of inverting differential amplifier 55', voltage VY', is connected to the drain of transistors 54', 58', the Vo leg of the differential amplifier. These internal connections cause differential transistor 52' receiving Vin to act as the non-inverting (+) input while differential transistor 54' receiving Vo acts as the inverting (−) input for non-inverting differential amplifier 55'.

For inverting differential amplifier 65', the gates of p-channel current-mirror transistors 66', 68' are connected together and to the drain of transistors 64', 68', the Vo leg of the differential amplifier. The output of inverting differential amplifier 65', voltage VX', is connected to the drain of transistors 62', 66', the Vin leg of the differential amplifier. These internal connections cause differential transistor 62' receiving Vin to act as the inverting (−) input while differential transistor 64' receiving Vo acts as the non-inverting (+) input for inverting differential amplifier 55'.

The output VX' of inverting differential amplifier 65' drives the gate of p-channel output transistor 60, which sources current from the power supply to the output Vo. The output VY' of non-inverting differential amplifier 55' is first inverted by an inverting stage of transistors 42', 44'. Output voltage VY' drives the gate of p-channel inverting transistor 42', which has its source connected to the power supply and its drain connected to the drain of n-channel inverting transistor 44'. The gate and drain of n-channel inverting transistor 44' are connected together so that n-channel inverting transistor 44' acts to sink current from p-channel inverting transistor 42'.

The gate and drain of n-channel inverting transistor 44' is node voltage VZ', which drives the gate of n-channel output transistor 50. N-channel output transistor 50 has its drain connected to output Vo and its source connected to ground.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A unity-gain amplifier comprising:

an input for receiving an input voltage;

an output having an output voltage;

a first differential amplifier, receiving the input voltage and the output voltage, for generating a first voltage on a first node, the first voltage rising when the input voltage rises above the output voltage;

an inverting stage, coupled to the first node, receiving the first voltage, for generating a second voltage on a second node, the second voltage falling when the first voltage rises;

a pull-up transistor, having a gate coupled to the second node, for driving a source current to the output, the pull-up transistor driving a larger source current when the second voltage is falling;

a second differential amplifier, receiving the input voltage and the output voltage, for generating a third voltage on a third node, the third voltage falling when the input voltage rises above the output voltage;

a pull-down transistor, having a gate coupled to the third node, for driving a sink current from the output, the pull-down transistor driving a smaller source current when the second voltage is falling; and a bias-voltage generator, coupled to the first differential amplifier and the second differential amplifier, for generating a bias voltage that is independent of the input voltage and the output voltage, the bias voltage being applied to the first and second differential amplifiers;

wherein the pull-up transistor drives a larger current but the pull-down transistor drives a smaller current when the input voltage rises above the output voltage, whereby the unity-gain amplifier is a push-pull differential amplifier.

2. The unity-gain amplifier of claim 1 wherein the pull-up transistor is a p-channel transistor having a source connected to a power supply and a drain connected to the output and a gate connected to the second node;

wherein the pull-down transistor is an n-channel transistor having a source connected to a ground and a drain connected to the output and a gate connected to the third node, whereby an output stage uses p-channel and n-channel transistors.

3. The unity-gain amplifier of claim 2 wherein the first differential amplifier is a differential amplifier having the input coupled to a non-inverting differential gate and the output connected to an inverting differential gate;

wherein the second differential amplifier is a differential amplifier having the output coupled to a non-inverting differential gate and the input connected to an inverting differential gate, whereby the first differential amplifier is a non-inverting amplifier but the second differential amplifier is an inverting amplifier.

4. The unity-gain amplifier of claim 3 wherein the first and second differential amplifiers each comprise:

a current-source transistor having a gate that receives the bias voltage and a drain coupled to a split node;

an inverting differential transistor controlled by the inverting differential gate, for conducting current from the split node to an output node, the output node being the first node for the first differential amplifier but the third node for the second differential amplifier;

an inverting-leg current-mirror transistor, having a gate connected to a current-mirror node, for conducting a mirrored current from the output node;

a non-inverting differential transistor controlled by the non-inverting differential gate, for conducting current from the split node to the current-mirror node; and a non-inverting-leg current-mirror transistor, having a gate and a drain connected to the current-mirror node, for conducting a mirrored current from the current-mirror node, whereby dual-leg differential amplifiers are used.

5. The unity-gain amplifier of claim 4 wherein the current-source transistor is a p-channel transistor with a source connected to the power supply;

wherein the differential transistors are p-channel transistors; and wherein the current-mirror transistors are n-channel transistors with sources connected to the ground.

6. The unity-gain amplifier of claim 5 wherein the inverting stage comprises:

an n-channel inverting transistor, having a gate connected to the first node, a source connected to the ground, and a drain connected to the second node; and a p-channel inverting transistor, having a source connected to the power supply, and a gate and a drain together connected to the second node, whereby the inverting stage has an active pull-down but a passive pull-up.

7. The unity-gain amplifier of claim 6 wherein the bias-voltage generator further comprises:

a p-channel transistor, having a source connected to the power supply, and a gate and a drain together connected to a bias node having the bias voltage;

a resistor, connected between the bias node and the ground, for generating a voltage drop that sets the bias voltage as a function of a current supplied by the p-channel transistor, whereby a voltage divider generates the bias voltage.

8. A complementary metal-oxide-semiconductor (CMOS) amplifier comprising:

an n-channel output transistor, having a source coupled to a ground, a drain coupled to an output, and a gate driven by a third node;

a p-channel output transistor, having a source connected to a power supply, a drain connected to the output, and a gate driven by a second node;

a first differential amplifier having:
a source transistor for supplying a current to a split node;
a first differential transistor, having a gate connected to an input, a source connected to the split node, and a drain connected to a first internal node;
a second differential transistor, having a gate connected to the output, a source connected to the split node, and a drain connected to a first node;
a first mirror transistor, having a gate connected to the first internal node, a source connected to the ground, and a drain connected to the first internal node;
a second mirror transistor, having a gate connected to the first internal node, a source connected to the ground, and a drain connected to the first node;

an inverter, receiving the first node from the first differential amplifier, for generating a signal to the second node driving the gate of the p-channel output transistor;

a second differential amplifier having:
a second source transistor for supplying a current to a second split node;
a third differential transistor, having a gate connected to an input, a source connected to the second split node, and a drain connected to the third node;
a fourth differential transistor, having a gate connected to the output, a source connected to the second split node, and a drain connected to a third internal node;
a third mirror transistor, having a gate connected to the third internal node, a source connected to the ground, and a drain connected to the third internal node; and
a fourth mirror transistor, having a gate connected to the third internal node, a source connected to the ground, and a drain connected to the third node, whereby the output is driven by a push-pull differential amplifier.

9. The CMOS amplifier of claim 8 wherein the first, second, third, and fourth mirror transistors are n-channel transistors; and wherein the first, second, third, and fourth differential transistors are p-channel transistors.

10. The CMOS amplifier of claim 9 wherein the source transistor and the second source transistor are p-channel transistors.

11. The CMOS amplifier of claim 10 wherein the inverter comprises:

a first inverting transistor, having a gate that receives the first node from the first differential amplifier, with a drain coupled to the second node that drives the gate of the p-channel output transistor, and a source coupled to the ground.

12. The CMOS amplifier of claim 11 further comprising:

a voltage divider for generating a bias voltage that is independent of the input and the output;

wherein the source transistor has a gate that receives the bias voltage;

wherein the second source transistor has a gate that receives the bias voltage, whereby the voltage divider generates the bias voltage.

13. The CMOS amplifier of claim 12 wherein the voltage divider comprises:

a p-channel bias transistor, having a source coupled to the power supply, and a gate and a drain both coupled to generate the bias voltage; and a resistance from the drain of the p-channel bias transistor to the ground.

14. The CMOS amplifier of claim 13 wherein the inverter further comprises:

a p-channel bias transistor, having a gate receiving the bias voltage, a source coupled to the power supply, and a drain coupled to the second node;

wherein the first inverting transistor is an n-channel transistor.

15. A differential amplifier comprising:

an input for receiving an input voltage;

an output having an output voltage;

first differential amplifier means, receiving the input voltage and the output voltage, for generating a first voltage on a first node, the first voltage falling when the input voltage rises above the output voltage;

pull-up transistor means, having a source current controlled by the first node, for driving the source current to the output, the pull-up transistor means driving a larger source current when the first voltage is falling;

second differential amplifier means, receiving the input voltage and the output voltage, for generating a second voltage on a second node, the second voltage falling when the input voltage rises above the output voltage; and inverting means, coupled to the second node, receiving the second voltage, for generating a third voltage on a third node, the third voltage falling when the second voltage rises;

pull-down transistor means, having a sink current controlled by the third node, for driving the sink current from the output, the pull-down transistor means driving a smaller source current when the third voltage is falling;

wherein the pull-up transistor means is a p-channel transistor having a source connected to a power supply and a drain connected to the output and a gate connected to the first node;

wherein the pull-down transistor means is an n-channel transistor having a source connected to a ground and a drain connected to the output and a gate connected to the third node;

wherein the pull-up transistor means drives a larger current but the pull-down transistor means drives a smaller current when the input voltage rises above the output voltage, whereby the differential amplifier is a push-pull differential amplifier.

16. The differential amplifier of claim 15 wherein the first and second differential amplifier means each comprise:

a current-source transistor having a gate that receives a bias voltage and a drain coupled to a split node;

an inverting differential transistor controlled by an inverting differential gate, for conducting current to the split node from an output node, the output node being the first node for the first differential amplifier but the second node for the second differential amplifier;

an inverting-leg current-mirror transistor, having a gate connected to a current-mirror node, for conducting a mirrored current to the output node;

a non-inverting differential transistor controlled by a non-inverting differential gate, for conducting current to the split node from the current-mirror node; and a non-inverting-leg current-mirror transistor, having a gate and a drain connected to the current-mirror node, for conducting a mirrored current to the current-mirror node, whereby differential amplifiers are used.

17. The differential amplifier of claim 16 wherein the current-source transistor is a n-channel transistor with a source connected to the ground;

wherein the differential transistors are n-channel transistors; and wherein the current-mirror transistors are p-channel transistors with sources connected to the power supply.

18. The differential amplifier of claim 17 further comprising:

bias-voltage generator means, coupled to the first differential amplifier means and the second differential amplifier means, for generating a bias voltage that is independent of the input voltage and the output voltage, the bias voltage being applied to the first and second differential amplifier means.

* * * * *